(12) United States Patent
Sherohman et al.

(10) Patent No.: US 7,224,041 B1
(45) Date of Patent: May 29, 2007

(54) DESIGN AND FABRICATION OF 6.1-Å FAMILY SEMICONDUCTOR DEVICES USING SEMI-INSULATING A1SB SUBSTRATE

(75) Inventors: John W. Sherohman, Livermore, CA (US); Arthur W. Coombs, III, Patterson, CA (US); Jick Hong Yee, Livermore, CA (US); Kuang Jen J. Wu, Cupertino, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/856,175

(22) Filed: May 28, 2004

Related U.S. Application Data

(60) Provisional application No. 60/507,742, filed on Sep. 30, 2003, provisional application No. 60/520,903, filed on Nov. 17, 2003.

(51) Int. Cl.
*H01L 29/12* (2006.01)
*H01L 31/0328* (2006.01)

(52) U.S. Cl. ............... 257/613; 257/22; 257/190; 257/201

(58) Field of Classification Search ............... 257/22, 257/183, 190, 201
See application file for complete search history.

(56) References Cited

U.S. PATENT DOCUMENTS

| | | | |
|---|---|---|---|
| 4,184,171 A | | 1/1980 | Panish |
| 4,368,098 A | | 1/1983 | Manasevit |
| 4,538,165 A | * | 8/1985 | Chang et al. ............ 257/192 |
| 5,159,421 A | * | 10/1992 | Wolff ..................... 257/22 |
| 5,349,202 A | * | 9/1994 | Uemura .................. 257/25 |
| 5,432,124 A | | 7/1995 | Nishikata et al. |
| 6,274,882 B1 | | 8/2001 | Verie et al. |
| 6,586,669 B2 | | 7/2003 | King et al. |
| 2002/0185655 A1 | | 12/2002 | Fahimulla et al. |

FOREIGN PATENT DOCUMENTS

| | | |
|---|---|---|
| EP | 0229263 B1 | 3/1992 |
| EP | 0565054 A2 | 10/1993 |
| EP | 1009034 A1 | 6/2000 |
| WO | WO 2004/031456 A2 | 4/2004 |

OTHER PUBLICATIONS

McMorrow et al, "Charge-Collection Dynamics of AlSb-InAs-GaSb Resonant Interband Tunneling Diodes (RITDs)." IEEE Transactions on Nuclear Science, vol. 48, No. 6, Dec. 2001. pp. 1973-1979.

Marcadet et al, "Material Engineering for InAs/GaSb/AlSb Quantum Cascade Light Emitting Devices." Thales Research & Technology, Domaine de Corbeville, 91404 Orsay Cedex, France. IEEE 2002. pp. 41-42.

Meyers et al, "Bias and Temperature Dependence of Sb-Based Heterostructure Millimeter-Wave Detectors With Improved Sensitivity." IEEE Electron Device Letters, vol. 25, No. 1, Jan. 2004. pp. 4-6.

(Continued)

*Primary Examiner*—Ori Nadav
(74) *Attorney, Agent, or Firm*—Michael C. Staggs; John H. Lee

(57) ABSTRACT

For the first time, an aluminum antimonide (AlSb) single crystal substrate is utilized to lattice-match to overlying semiconductor layers. The AlSb substrate establishes a new design and fabrication approach to construct high-speed, low-power electronic devices while establishing inter-device isolation. Such lattice matching between the substrate and overlying semiconductor layers minimizes the formation of defects, such as threaded dislocations, which can decrease the production yield and operational life-time of 6.1-Å family heterostructure devices.

23 Claims, 3 Drawing Sheets

OTHER PUBLICATIONS

Tsai et al, "MMIC Compatible AlSb/InAs HEMT with Stable AlGaSb Buffer Layers." TRW Space and Electronics Group, One Space Park, Redondo Beach, CA 90278, USA. Naval Research Laboratory, Washington, DC 20375-5320, USA. pp. 276-280. 2002 IEEE.

Magno et al, "Antimony-based Quarternary Alloys for High-Speed Low-Power Electronic Devices." Naval Research Laboratory, Washington, D.C. 20375, USA. TRW Space and Electronics Group, One Space Park, Redondo Beach, CA 90278, USA. pp. 288-296. Lester Eastman Conference. IEEE Aug 2002.

Brar et al, "RF and DC Characteristic of Low-Leakage InAs/AlSb HFETs." IEEE 2002. pp. 409-411.

Tsai et al, "Metamorphic AlSb/InAs HEMT for Low-Power, High-Speed Electronics." Northrop Grumman Space Technology, Inc., Redondo Beach, CA 90278. 2003 IEEE. pp. 294-297.

Schulman et al, "Sb-Heterostructure Interband Backward Diodes." 2000 IEEE. pp. 353-355.

Lin et al, "InAs/InAsP Composite Channels for Antimonide-Based Field-Effect Transistors." 2004 American Institute of Physics. pp. 437-439.

Tsai et al, "MMIC Compatible AlSb/InAs HEMT with Stable AlGaSb Buffer Layers." TRW Space and Electronics Group, One Space Park, Redondo Beach, CA 90278, USA. Naval Research Laboratory, Washington, DC 20375-5320, USA. pp. 276-280.

Magno et al, "Antimony-based Quarternary Alloys for High-Speed Low-Power Electronic Devices." Naval Research Laboratory, Washington, D.C. 20375, USA. TRW Space and Electronics Group, One Space Park, Redondo Beach, CA 90278, USA. pp. 288-296.

G. Triplett et al, "Modeling Electron Mobility in MBE-Grown InAs/AlSb Thin Films For HEMT Applications Using Neural Networks." Solid-State Electronics 46 (2002) pp. 1519-1524. School of Electrical & Computer Engineering. Georgia Institute of Technology, Atlanta, GA.

R. Kaspi et al, "Bilayer Growth Period Oscillation of the $Sb_2$ Reactivity During Molecular Beam Epitaxy of AlSb." 1997 American Institute of Physics, pp. 3537-3539.

A. Bracker et al, "Stoichiometry-Induced Roughness On Antimonide Growth Surfaces." Appied Physics Letters, vol. 78, No. 17, Apr. 23, 2001. pp. 2440-2442.

R. Gunshor et al, "MBE Of Wide Bandgap II-VI Compounds." 2300 Journal of Crystal Growth 99Jan. 1990, Nos. 1/4, Amsterdam, NL. pp. 390-398. Elsevier Science Publishers B.V. (North-Holland).

B. Bennett et al, "Monolithic Integration of Resonant Interbandd Tunneling Diodes and High Electron Mobility Transistors In The InAs/GaSb/AlSb Material System." Naval Research Laoratory, Washington, DC. J. Vac. Sc. Technol. B 18(3) May/Jun. 2000. pp. 1650-1652.

\* cited by examiner

US 7,224,041 B1

DESIGN AND FABRICATION OF 6.1-Å FAMILY SEMICONDUCTOR DEVICES USING SEMI-INSULATING AlSB SUBSTRATE

RELATED APPLICATION

This application claims the benefit of U.S. Provisional Application No. 60/507,742, filed Sep. 30, 2003, and entitled, "Design and Fabrication of 6.1-Å Family III-V Semiconductor Devices Using Semi-Insulating AlSb Substrate," and U.S. Provisional Application No. 60/520,903, filed Nov. 17, 2003, entitled "Design and Fabrication of 6.1-Å Family III-V Semiconductor Devices Using Semi-Insulating AlSb Substrate" which are incorporated herein by this reference.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to semiconductors. More specifically, the present invention relates to bulk single crystal Aluminum Antimonide (AlSb) substrates incorporated with heterostructures from the 6.1-Å family of semiconductors.

2. State of Technology

Antimonide/Arsenide heterostructures are recognized in the semiconductor industry as revolutionary low-noise, low-power, high-speed electronic devices. The composition of the Antimonide/Arsenide heterostructure is composed of multiple layers of Antimonide and Arsenide semiconductor compounds such as AlSb, GaSb, InAs, and related ternary and quaternary alloys from the elements of Al, As, Ga, In, and Sb. These Antimonide and Arsenide semiconductor compounds have a crystal structure dimension or lattice parameter that is nearly matched at 6.1 Å (Angstrom). Such compounds are identified as lattice-matched 6.1-Å family III-V semiconductors.

Recent research and development of the 6.1-Å family heterostructure devices, has lead to fabrication of state-of-the-art electronic devices, e.g., high electron mobility transistors (HEMTs), heterostructure field-effect transistors (HFETs), resonant interband tunneling diodes (RITDs), heterojunction bipolar transistors (HBTs), hybrid superconductor/semiconductor (HSS) devices, magneto-electronic devices (e.g., Hybrid Hall effect device), quantum cascade lasers (QCLs), infrared photodiodes, and infrared detectors. The development of Antimonide/Arsenide heterostructure devices has demonstrated that such devices can be used for high-speed analog and digital applications, high-speed logic applications, innovative multi-function radar and communication systems, and mid-infrared lasing and detection applications. Such applications strongly impact military and national security interest as well as commercialization interest.

However, fabrication of 6.1-Å family heterostructure devices is complicated because available semi-insulating (SI) substrates, i.e., substrates with very high resistivity ($\rho$) at room temperature ($\rho 300$ greater than about $10^7$ $\Omega \cdot cm$) do not have a suitable lattice parameter for lattice matching semiconductors from the 6.1-Å family III-V or the 6.1-Å family II-VI (e.g., Zinc Telluride (ZnTe)) semiconductors. For example, the room temperature lattice parameter of the desirable III-V SI GaAs substrate is 5.653 Å and the room temperature lattice parameter of the III-V SI InP substrate is 5.869 Å. In the case of GaAs, the lattice mismatch is about 8% when heterostructures from the 6.1-Å III-V family are used for desired devices, which can create about $10^8$ cm$^{-2}$ surface dislocations. Moreover, 6.1-Å family II-VI heterostructure devices (e.g. ZeTe) grown on such GaAs substrates, also results in a mismatch coefficient of about 7.4%, which induces compressed strain along the interface.

Because of such disparate lattice mismatches, device fabrication using such substrates requires a buffer layer material (often a relatively thick layer of up to a few microns of a semiconductor material, such as AlSb) arranged between a substrate and heterostructure to counter surface dislocation nucleation. The use of such buffer layers remains a fabrication issue because surface dislocations, known as threading dislocations, can still travel through the buffer layer material and severely degrade device performance by acting as radiative (photon) and non-radiative (phonon) recombination centers.

Background information on such a buffer layer requirement and remaining fabrication issues can be found in, "The 6.1 Å family (InAs, GaSb, AlSb) and its heterostructures: a selective review," by Herbert Kroemer, Physica E 20, pp. 196–203, 2004, including the following, "When the MBE growth is performed on lattice-mismatched GaAs substrates rather than on GaSb, the interposition of a proper buffer layer is essential for high quality growth . . . Using GaSb for the initial nucleation leads to very rough initial morphology. Nucleating with AlSb leads to much less initial surface roughness, but the residual roughness persists with continued growth, and leads to InAs quantum wells with poor transport properties. Following the initial thin AlSb nucleation layer with a thick ($\approx 1$ μm) GaSb buffer layer smoothes out the surface morphology, and if the growth is then switched to AlSb or (Al, Ga)Sb, the smooth surface persist, leading to InAs quantum wells with much better transport properties."

Accordingly, a need exists for a high-speed low-power electronic heterostructure device that includes a single crystal, lattice-matched, semi-insulating substrate to replace the current use of lattice-mismatched substrates of SI GaAs or SI InP. Such a need has been jointly emphasized by several, such as Naval Research Laboratory (NRL) and TRW researchers at the August 2002 IEEE Lester Eastman Conference on High Performance Devices, "A semi-insulating substrate is required for complex circuits, and none exist with a lattice constant near 6.2 Å," IEEE Proceedings, pp. 288–296, 2002. The present invention is directed to such a need.

SUMMARY OF THE INVENTION

Accordingly, the present invention provides a method of forming a semiconductor device that includes: providing an AlSb substrate; and growing one or more semiconductor layers substantially lattice matched to the AlSb substrate.

Another aspect of the present invention is to provide a method of forming a semiconductor device that includes: providing an AlSb substrate; and growing a semiconductor heterostructure substantially lattice matched to the AlSb substrate, wherein the semiconductor device is capable of being arranged with one or more buffer layers intermediate the AlSb substrate and the semiconductor heterostructure.

A further aspect of the present invention is to provide a semiconductor device that includes an AlSb substrate and one or more semiconductor layers grown on the AlSb substrate, wherein the one or more semiconductor layers are substantially lattice matched to the AlSb substrate.

A final aspect of the present invention is to provide a semiconductor device that includes an AlSb substrate and a semiconductor heterostructure grown on the AlSb base substrate, wherein the heterostructure is substantially lattice matched to the AlSb substrate and wherein the one or more buffer layers are capable of being arranged intermediate the AlSb substrate and the heterostructure.

Accordingly, the present invention provides a semi-insulating (SI) Aluminum Antimonide (AlSb) single crystal substrate capable of having a resistivity ($\rho$) at room temperature ($\rho$ 300 K°) of greater than about $10^3$ $\Omega$·cm, more often greater than about $10^7$ $\Omega$·cm to be utilized in the design and fabrication of 6.1-Å family Antimonide/Arsenide heterostructures devices. The use of SI AlSb of the present invention provides a substantially lattice-matched substrate to construct high-speed low-power Antimonide/Arsenide and/or Zinc/Telluride heterostructures electronic devices such as, but not limited to, HEMTs, HFETs, RITDs, HBTs, HSS structures, and magneto-electronic devices (e.g., the Hybrid Hall effect device). Such a high resistivity AlSb substrate also allows for inter-device isolation for other Antimonide/Arsenide and/or Zinc/Telluride heterostructures such as QCLs, photodiodes, infrared photodiodes, and infrared detectors. Fabrication of such heterostructures using SI Aluminum Antimonide (AlSb) single crystal substrates substantially minimizes the nucleation of threading dislocations. As a result, production yield and operational life-time of Antimonide/Arsenide and/or Zinc/Telluride heterostructure devices configured with such substrates are enhanced over similar devices, such as devices that incorporate SI GaAs or SI InP substrates.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Figure 1:
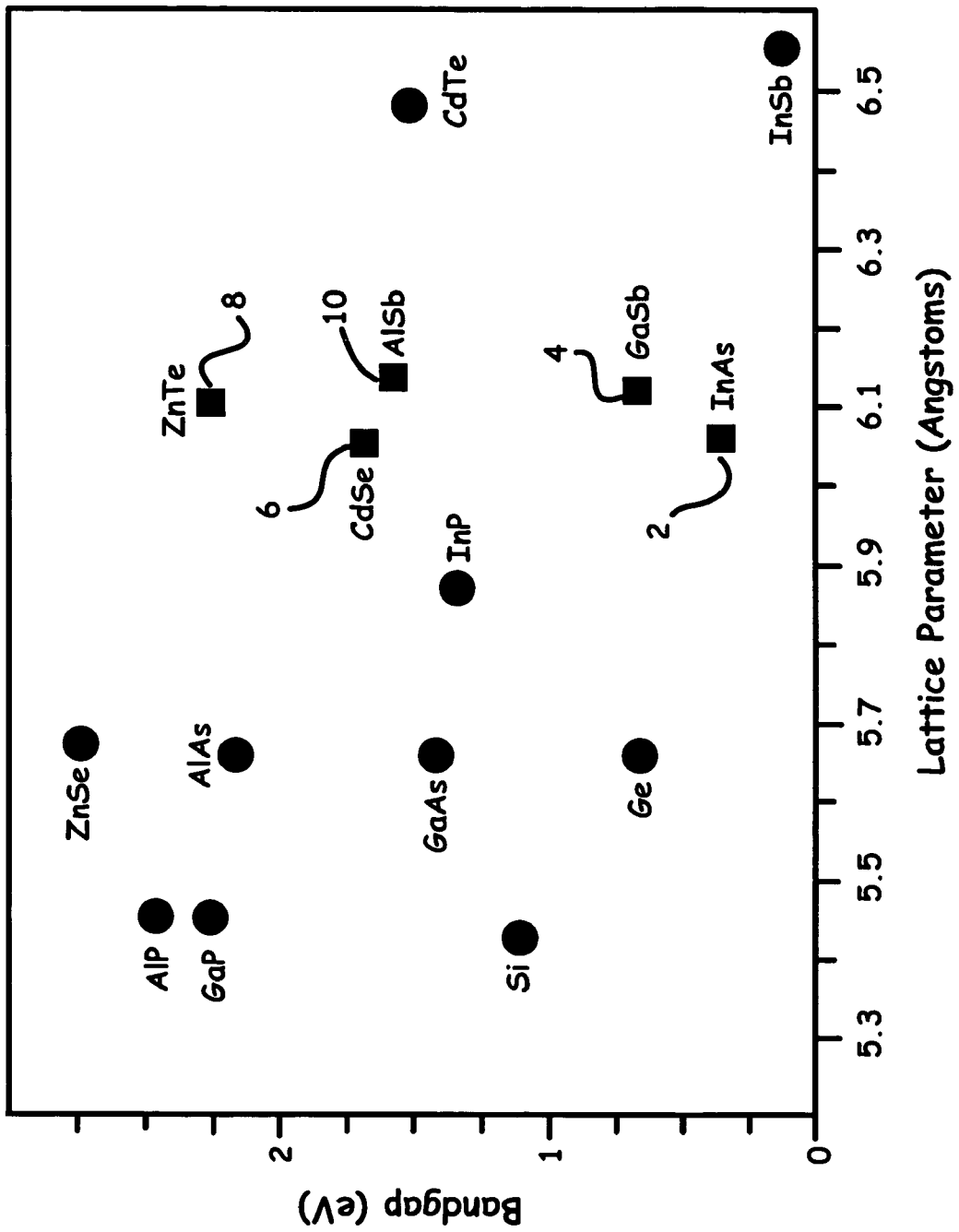
FIG. 1 shows lattice constants vs. band gaps for various pure and compound semiconductors.

Referring now to the following detailed information, and to incorporated materials; a detailed description of the invention, including specific embodiments, is presented. The detailed description serves to explain the principles of the invention.

Unless otherwise indicated, all numbers expressing quantities of ingredients, constituents, reaction conditions and so forth used in the specification and claims are to be understood as being modified in all instances by the term "about". Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

General Description

An Aluminum Antimonide (AlSb) semiconductor substrate material is a member of the III-V family of semiconductors including Gallium Arsenide (GaAs), Indium Antimonide (InSb), Gallium Phosphide (GaP), etc. Similar to Germanium (Ge), Silicon (Si) and GaAs, AlSb has a zinc-blend cubic crystal structure, similar to Ge and Si, but unlike GaAs, AlSb has an indirect energy band gap, and similar to GaAs, but unlike Ge and Si, the energy band gap (Eg) is relatively high, i.e., an Eg of about 1.62 eV. Such structure and band-gap features of AlSb provide a material that is beneficial as an electronic device quality semiconductor substrate when utilized with heterostructures from the 6.1 Å III-V family of semiconductors, such as AlSb, GaSb and Indium Arsenide (InAs).

Moreover, the AlSb substrate of the present invention can also be arranged with II-VI 6.1-Å family semiconductors, such as, for example, Zinc Telluride (ZnTe) and Cadmium Selenide (CdSe), to provide desired semiconductor heterostructure devices. Specifically, ZnTe is a compound that can be incorporated into the present invention because such a compound has a direct energy band gap of 2.26 eV and a zinc-blend structure with a lattice constant of 6.10037 Å. By virtue of such a band gap, ZnTe provides a substantially lattice matched material with the AlSb substrate of the present invention to construct heterostructure opto-electronic devices in the blue-green region, such as pure green light emitting diodes (LEDs) and laser diodes (LDs).

Heterostructures, as utilized in the present invention, can include one or more thin layers (between about 10 Å and up to about 2 μm) of binary compounds such as, but not limited to Aluminum Antimonide (AlSb), Gallium Antimonide (GaSb), Indium Arsenide (InAs), Zinc Telluride (ZnTe), and/or related ternary and quaternary alloys of such materials. For example, Antimonide (Sb) and Arsenide (As) semiconductor compounds are exemplary materials that can be utilized in the present invention due to an inherent crystal structure dimension or lattice parameter that is substantially lattice matched at 6.1 Angstroms, e.g., the room temperature lattice constant of AlSb is 6.135 Å, for GaSb it is 6.095 Å, and for InAs it is 6.058 Å.

FIG. 1 illustrates lattice constants vs. band gaps for various pure and compound semiconductors. The present invention incorporates the 6.1 Å family semiconductors, such as, for example, InAs 2, GaSb 4, CdSe 6, ZnTe 8, and AlSb 10 (also denoted by squares). Accordingly, compounds, such as AlSb, GaSb, InAs, ZnTe, CdSe and related ternary and quaternary alloys from the elements of Al, As, Ga, In, Sb, Cd, Se, Zn, and Te are herein identified as substantially lattice-matched 6.1-Å family semiconductors that can utilized in the present invention.

The present invention utilizes such 6.1-Å family semiconductors identified above, by growing such materials on a substrate material as disclosed herein with or without an intermediate buffer layer (i.e., a buffer layer, such as, for example, a layer of AlSb or layers containing Sb compounds, is herein defined as an intermediate material layer sandwiched between a substrate and a heterostructure). Such a buffer layer's functions can include crystal lattice matching, electrical isolation and/or surface smoothing.

The Aluminum Antimonide (AlSb) single crystal substrate utilized herein is capable of having a substantially uniform resistivity (ρ) as measured over the entire produced substrate at room temperature (300 K°) of often greater than about $10^3$ Ω·cm, more often greater than about $10^7$ Ω·cm. Such AlSb crystal substrates of the present invention can be produced by a Czochralski (CZ) growth technique. However, other growth methods such as, but not limited to, a Traveling Heating Method (THM), capable of producing quality crystals may also be employed. A detailed disclosure of example methods of producing such a single crystal substrate is disclosed in Incorporated by reference, Co-pending, U.S. application Ser. No. 10/260,141, titled "High Resistivity Aluminum Antimonide Radiation Detector" by Sherohman et al., assigned to the assignee of the present invention, the disclosure herein incorporated by reference in its entirety.

Such a crystal substrate is beneficial in the design and fabrication of heterostructure devices that utilize semiconductor materials from the 6.1-Å family semiconductors as described above, e.g., GaSb, InAs, AlSb, ZnTe, CdSe and various combinations of the elements Al, As, Ga, In, Sb, Zn, Te, Cd, and Se thereof. Being a member of the 6.1-Å family semiconductors, the use of AlSb provides a lattice-matched substrate to such overlying semiconductor materials so as to construct high-speed (e.g., quantum tunneling devices capable of oscillating at up to about 1 THz) low-power electronic devices such as, but not limited to, HEMTs, HFETs, RITDs, HBTs, HSS structures, and magneto-electronic devices (e.g., the Hybrid Hall effect device).

In addition, the present invention's high resistivity capability of greater than about $10^7$ Ω·cm AlSb substrate allows for interdevice isolation for other heterostructures, such as, but not limited to, Antimonide/Arsenide QCLs, infrared photodiodes, and infrared detectors. Moreover, device fabrication using a lattice matched AlSb substrate as disclosed herein, minimizes the nucleation of threading dislocations. As a result, the production yield and operational life-time of 6.1-Å family heterostructure devices grown on an AlSb substrate are enhanced over similar devices that use SI GaAs or SI InP substrates.

Specific Description

Figure 2B:
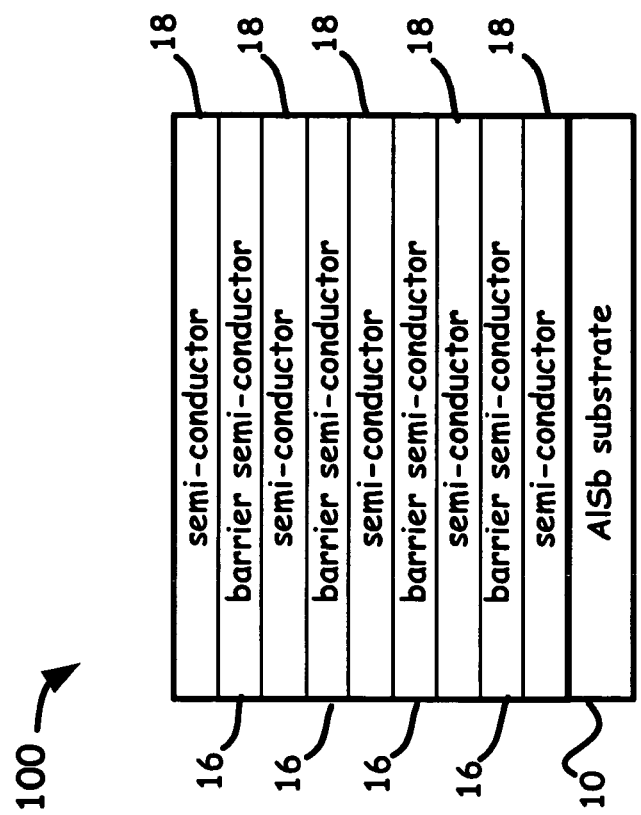
FIG. 2(b) illustrates heterostructure device of the present invention having an AlSb substrate.
Figure 2A:
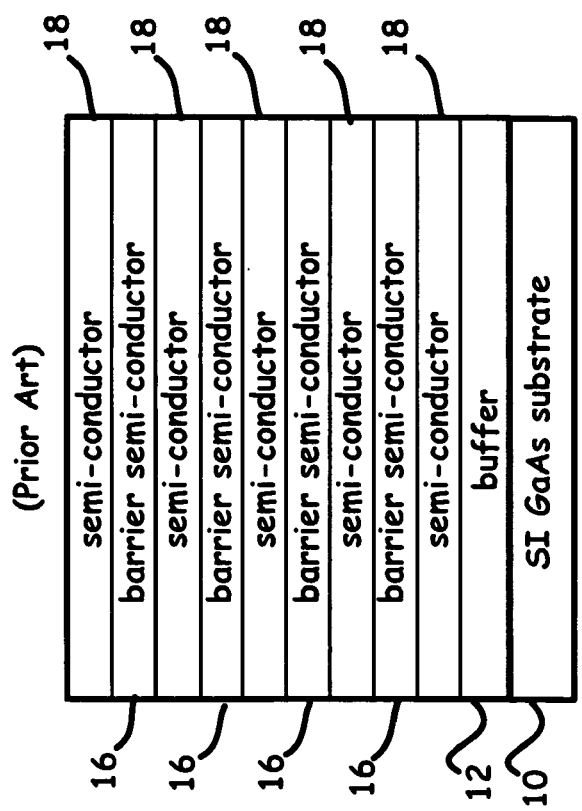
FIG. 2(a) illustrates a conventionally grown heterostructure device having a GaAs SI substrate.

FIG. 2(a) shows an example of the basic concept that exemplifies conventionally grown heterostructure semiconductor devices, e.g., HEMTs, HFETs, RITDs, HBTs, etc., that incorporate semiconductor materials within the 6.1-Å family such as, for example, Aluminum Antimonide (AlSb), Gallium Antimonide (GaSb), Indium Arsenide (InAs), Zinc Telluride (ZnTe) and/or their related ternary and quaternary alloys as previously disclosed. Such devices utilize a semi-insulating substrate 10, such as GaAs, and one or more overlying layers 12, such as, but not limited to AlSb, or layers containing Sb compounds, to buffer and/or smooth lattice mismatches between substrate 10 and overlying semiconductor layers 16, 18, to prevent non-uniformities, such as threaded dislocations.

Semiconductor layers 16, such as AlSb, and alternating semiconductor layers 18 such as semiconductor layers from the 6.1-Å family doped with materials such as, but not limited to, Silicon (Si), Tellerium (Te), Selenium (Se), Beryllium (Be), and Tin (Sn), can be grown according to methods known in the art, such as by molecular beam epitaxy (MBE), to create barrier layers, channels (current paths), caps, Schottky barriers, etc., so as to form what is know to those skilled in the art as semiconductor heterostructures. In addition, an oxidation barrier (not shown) can be grown so as to protect underlying layers of materials, e.g., 16, 18, and metalized ohmic contacts (not shown), can be applied to predetermined layers according to methods known in the art to provide such devices with a means for such devices to be integrated into a desired circuitry.

FIG. 2(b) shows a basic example configuration of a heterostructure semiconductor device of the present invention, generally designated as reference numeral 100, that utilizes similar semiconductor layers from the 6.1-Å family as discussed above. Such a device incorporates a substantially uniform high resistivity AlSb substrate 10 of often greater than about $10^3$ Ω·cm, more often greater than about $10^7$ Ω·cm, capable of semi-insulating one or more overlying heterostructure layers 16, 18. Device fabrication using such an AlSb substrate 10 as disclosed herein, in addition to providing a semi-insulating base substrate, minimizes the nucleation of threading dislocations as a result of the substantial lattice matching to overlying 6.1-Å family semiconductor layers, resulting in an increase in the operational life-time of 6.1-Å family heterostructure devices, such as HEMTs, HFETs, RITDs, HBTs, LEDs, HSS structures, and magneto-electronic devices (e.g., the Hybrid Hall effect device).

Figure 3:
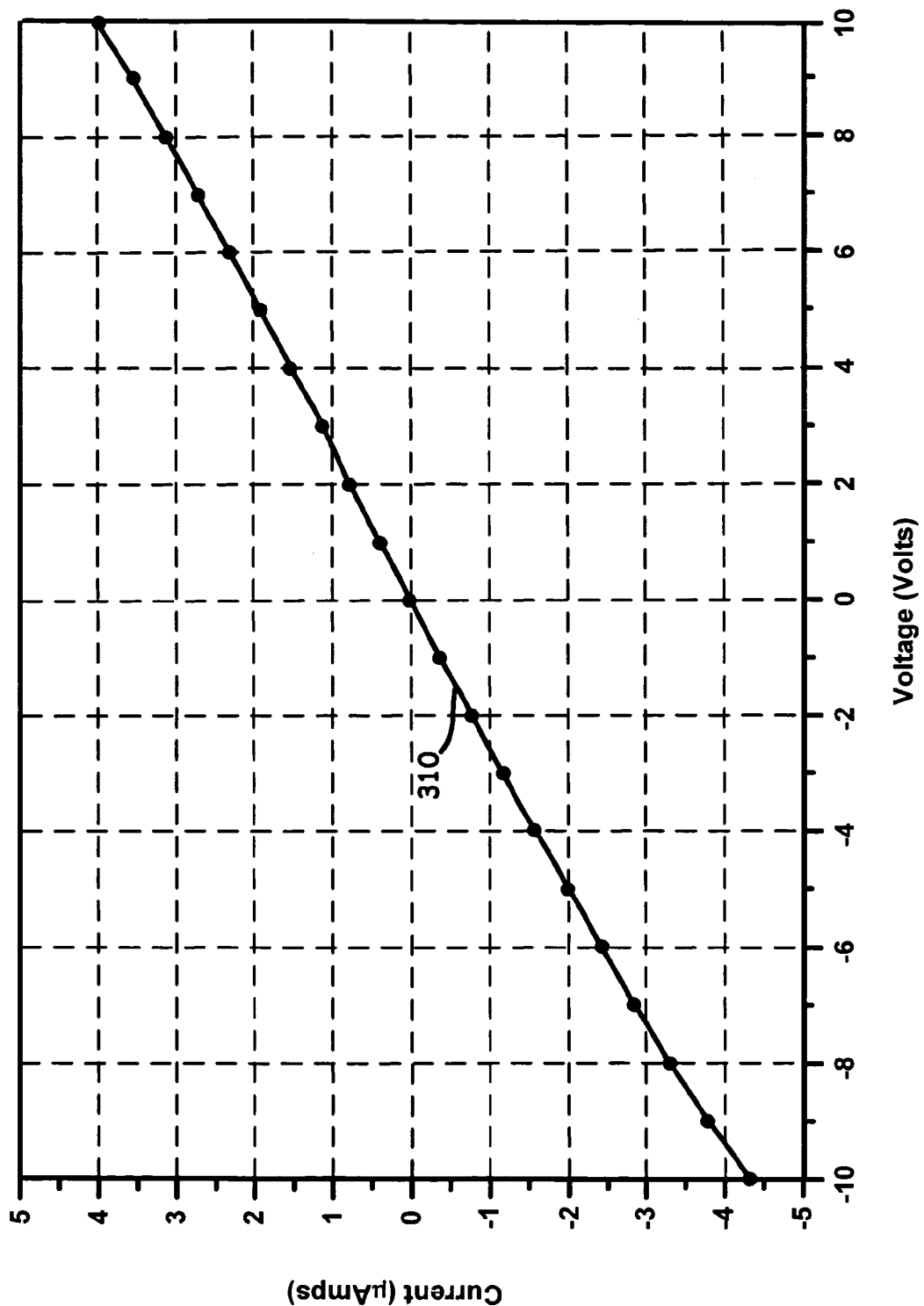
FIG. 3 illustrates a current versus voltage (I-V) curve of the substrate material to be utilized in heterostructures.

FIG. 3 shows an I-V curve 310 (current versus voltage) of a substrate material of the present invention illustrating current levels capable of being produced within such a substrate between about −4.5 μamps and about +4 μamps when subjected to respective voltages between about −10 volts and about +10 volts. Such a measurement involves measuring an electrical current flow across a sample material, such as an AlSb bulk crystal utilized in the present invention, when a DC voltage is applied onto a given sample. I-V curve 310, as shown in FIG. 3, represents the basic electrical properties of a substrate AlSb material used in a device such as a heterostructure, fabricated from such a material as disclosed herein.

In making the measurements to produce such a curve as shown in FIG. 3, a thin piece of AlSb sample measuring about 1 cm×1 cm×0.1 cm and mechanically polished to about ¼ micron finish is arranged with approximately 1000 Å thick and 6 mm diameter of gold sputtered onto the sample's surface to establish electrical contacts. An I-V measurement then is conducted at room temperature (300 K°) at a voltage range between about −10V and about +10V, which covers the operating voltage regime for most of the common electrical devices. Such an I-V characteristic is ohmic in nature and a resulting response current of about ±5 μA, as shown in FIG. 3, is produced when an AlSb substrate sample of the present invention is subjected to the imposed measurement conditions. Previous reports as disclosed in, "Electrical Properties of Semiconducting AlSb", by R. K. Willardson, A. C. Beer and A. E. Middleton, *J. Electro. Chem. Soc.* 101, 354 (1954); and in "Some Properties of aluminium antimonide p-n junctions", by C. R. Bemrose, *Solid-State Electronics*, 7, 765 (1964), show AlSb I-V measurements response currents with similar measurement conditions in the hundreds of μA to mA ranges.

Accordingly, an AlSb substrate of the present invention that can produce such a surprising I-V curve as shown in FIG. 3, illustrates the semi-insulating properties of such a substrate having a lattice constant of 6.1 Å that can fulfill a need in the industry to produce desired electronic devices. As discussed above, researchers at The Naval Research Laboratory (NRL) and TRW at the August 2002 IEEE Lester Eastman Conference on High Performance Devices stated such an industry need by stating, "A semi-insulating substrate is required for complex circuits, and none exist with a lattice constant near 6.2 Å," IEEE Proceedings, pp. 288–296, 2002.

Moreover, in addition to applications as discussed above, heterostructure devices, such as, but not limited to Antimonide/Arsenide heterostructures, which have previously been fabricated on a GaSb substrate for infrared laser and infrared detector applications, can also incorporate an AlSb substrate as disclosed herein. Although GaSb is substantially lattice matched, such a substrate material is a very low band gap semiconductor (bandgap at 300° K for GaSb is 0.725 eV) and is therefore quite conducting at room temperature (resistivity of about 0.01 Ω·cm, which is much lower than the resistivity capability of AlSb greater than about $10^7$ Ω·cm), has a high carrier concentration, and low mechanical strength.

In addition to the above, as another example arrangement, for applications where GaSb has been used as a substrate, GaSb can be deposited on an AlSb substrate of the present invention to provide interdevice isolation and lattice matching properties as discussed above.

It is to be understood that the number of semiconductor layers and the variations disclosed herein are not limited to these numbers of layers and/or variations. While the example arrangements of the invention are described, various modifications may be made in such arrangements to cover all modifications, equivalents, and alternatives falling within the spirit and scope of the invention as defined by the following appended claims.

The invention claimed is:

1. A method of forming a semiconductor device, comprising:
providing a bulk single crystal semi-insulating AlSb substrate having a resistivity of greater than about $10^7$ Ω·cm; and
growing one or more semiconductor layers substantially lattice matched to said bulk single crystal semi-insulating AlSb substrate.

2. The method of claim 1, wherein said AlSb substrate is arranged to have a uniform resistivity capable of a providing a current between about −4.5 μamps and about +4 μamps when subjected to respective voltages between about −10 volts and about +10 volts.

3. The method of claim 1, wherein said one or more semiconductor layers comprises a compound from the 6.1-Å family III-V semiconductor family.

4. The method of claim 1, wherein said one or more semiconductor layers comprises a compound from the 6.1-Å family II-VI semiconductor family.

5. The method of claim 1, wherein said one or more semiconductor layers further comprise alternating layers of doped and undoped semiconductor materials.

6. A method of forming a semiconductor device, comprising:
providing a bulk single crystal semi-insulating AlSb substrate having a resistivity of greater than about $10^7$ Ω·cm; and
growing a semiconductor heterostructure substantially lattice matched to said bulk single crystal semi-insulating AlSb substrate, wherein said semiconductor device further comprises one or more buffer layers intermediate said bulk single crystal semi-insulating AlSb substrate and said semiconductor heterostructure.

7. The method of claim 6, wherein said AlSb substrate is arranged to have a uniform resistivity capable of a providing a current between about −4.5 μamps and about +4 μamps when subjected to respective voltages between about −10 volts and about +10 volts.

8. The method of claim 6, wherein said semiconductor heterostructure further comprises one or more binary, ternary, or quaternary, semiconductor layers comprising the 6.1-Å III-V family.

9. The method of claim 6, wherein said semiconductor heterostructure further comprises one or more binary, ternary, or quaternary, semiconductor layers comprising the 6.1-Å II-VI family.

10. The method of claim 6, wherein said one or more buffer layers are arranged so as to provide crystal lattice matching, electrical isolation and/or surface smoothing.

11. A semiconductor device, comprising:
a bulk single crystal semi-insulating AlSb substrate having a resistivity of greater than about $10^7$ Ω·cm; and
one or more semiconductor layers grown on said bulk single crystal semi-insulating AlSb substrate, wherein said one or more semiconductor layers are substantially lattice matched to said bulk single crystal semi-insulating AlSb substrate.

12. The semiconductor device of claim 11, wherein said AlSb substrate is arranged to have a uniform resistivity capable of a providing a current between about −4.5 μamps and about +4 μamps when subjected to respective voltages between about −10 volts and about +10 volts.

13. The semiconductor device of claim 11, wherein said one or more semiconductor layers further comprise one or more binary, ternary, or quaternary, semiconductor layers comprising the 6.1-Å III-V family.

14. The semiconductor device of claim 11, wherein said one or more semiconductor layers further comprise one or more binary, ternary, or quaternary, semiconductor layers comprising the 6.1-Å II-VI family.

15. The semiconductor device of claim 11, wherein said semiconductor layers are formed by molecular beam epitaxy.

16. The semiconductor device of claim 11, wherein said one or more semiconductor layers further comprise alternating layers of doped and undoped semiconductor materials.

17. A semiconductor device, comprising:
a bulk single crystal semi-insulating AlSb substrate having a resistivity of greater than about $10^7$ Ω·cm; and
a semiconductor heterostructure grown on said bulk single crystal semi-insulating AlSb base substrate, wherein said heterostructure comprises substantial lattice matching to said bulk single crystal semi-insulating AlS substrate and wherein said heterostructure further comprises one or more buffer layers intermediate said AlSb substrate and said heterostructure.

18. The semiconductor device of claim 17, wherein said AlSb substrate is arranged to have a uniform resistivity capable of a providing a current between about −4.5 μamps and about +4 μamps when subjected to respective voltages between about −10 volts and about +10 volts.

19. The semiconductor device of claim 17, wherein said semiconductor heterostructure further comprises one or more binary, ternary, or quaternary, semiconductor layers comprising the 6.1-Å III-V family.

20. The semiconductor device of claim 17, wherein said semiconductor heterostructure further comprises one or more binary, ternary, or quaternary, semiconductor layers comprising the 6.1-Å II-VI family.

21. The semiconductor device of claim 17, wherein said buffer layer is arranged so as to provide crystal lattice matching, electrical isolation and/or surface smoothing.

22. The semiconductor device of claim 17, wherein said semiconductor heterostructure is formed by molecular beam epitaxy.

23. The semiconductor device of claim 17, wherein said semiconductor heterostructure further comprises alternating layers of doped and undoped semiconductor materials.

* * * * *